(12) United States Patent
Hu et al.

(10) Patent No.: US 11,186,923 B2
(45) Date of Patent: Nov. 30, 2021

(54) METHOD FOR MANUFACTURING AN ULTRA SMALL GRAIN-SIZE NANOCRYSTALLINE DIAMOND FILM HAVING A SIV PHOTOLUMINESCENCE

(71) Applicant: ZHEJIANG UNIVERSITY OF TECHNOLOGY, Zhejiang (CN)

(72) Inventors: Xiaojun Hu, Zhejiang (CN); Chengke Chen, Zhejiang (CN)

(73) Assignee: ZHEJIANG UNIVERSITY OF TECHNOLOGY, Zhejiang (CN)

( * ) Notice: Subject to any disclaimer, the term of this patent is extended or adjusted under 35 U.S.C. 154(b) by 0 days.

(21) Appl. No.: 17/072,379

(22) Filed: Oct. 16, 2020

(65) Prior Publication Data

US 2021/0032773 A1    Feb. 4, 2021

Related U.S. Application Data

(62) Division of application No. 16/073,933, filed as application No. PCT/CN2017/103313 on Sep. 26, 2017, now abandoned.

(30) Foreign Application Priority Data

Sep. 30, 2016   (CN) .......................... 201610870721.7

(51) Int. Cl.
| | |
|---|---|
| C30B 25/10 | (2006.01) |
| C30B 29/04 | (2006.01) |
| C30B 25/18 | (2006.01) |
| C09K 11/65 | (2006.01) |
| C30B 35/00 | (2006.01) |
| C23C 16/27 | (2006.01) |

(Continued)

(52) U.S. Cl.
CPC .............. *C30B 29/04* (2013.01); *C09K 11/65* (2013.01); *C23C 16/274* (2013.01); *C23C 16/56* (2013.01); *C30B 25/105* (2013.01); *C30B 25/186* (2013.01); *C30B 35/007* (2013.01); *B33Y 30/00* (2014.12); *B33Y 40/00* (2014.12); *B82Y 30/00* (2013.01); *B82Y 40/00* (2013.01)

(58) Field of Classification Search
CPC ..... C30B 29/04; C30B 25/105; C30B 25/186; C30B 35/007; C23C 16/56; C23C 16/274
See application file for complete search history.

(56) References Cited

U.S. PATENT DOCUMENTS

| | | |
|---|---|---|
| 2015/0238125 A1 | 8/2015 | Acosta et al. |
| 2017/0020419 A1 | 1/2017 | Acosta et al. |

FOREIGN PATENT DOCUMENTS

CN            106498363 A      3/2017

*Primary Examiner* — Robert M Kunemund
(74) *Attorney, Agent, or Firm* — Muncy, Geissler, Olds and Lowe, P.C.

(57) ABSTRACT

A method for manufacturing an ultra small grain-size nanocrystalline diamond film having a SiV photoluminescence, comprises: (1) manufacturing, on a single crystal silicon substrate, a nanocrystalline diamond film having a SiV photoluminescence by using a microwave plasma chemical vapor deposition method; (2) performing oxygen plasma etching treatment on the nanocrystalline diamond film obtained in step (1) for 5-30 min by using an oxygen plasma bombardment method in a mixed gas plasma having an oxygen-nitrogen gas volume ratio of 1:4-6 and at an atmospheric pressure of 0.5-6 torr and a microwave power of 600-1000 W, thereby obtaining the ultra small grain-size nanocrystalline diamond film having the SiV photoluminescence.

5 Claims, 3 Drawing Sheets

Figure 1:
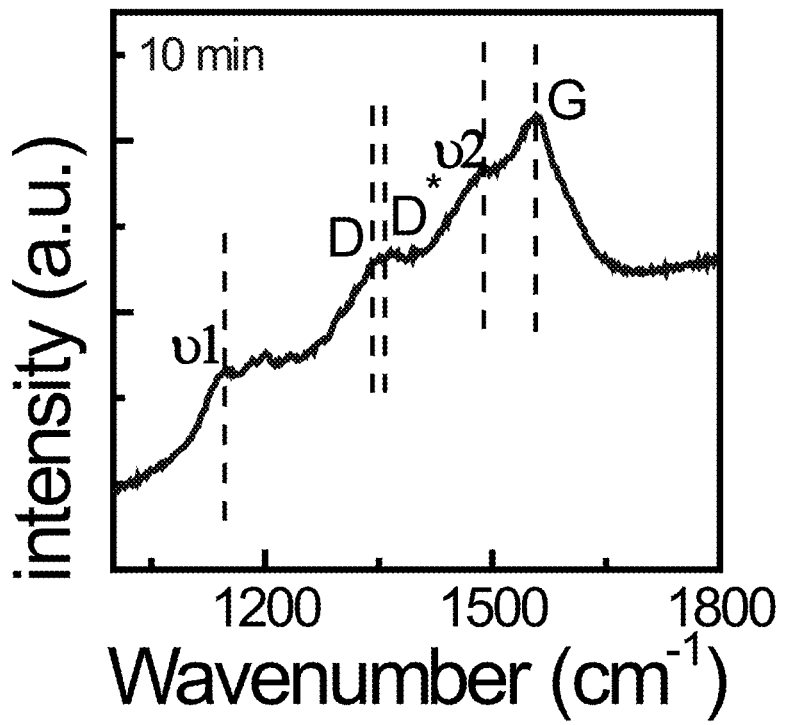

(51) Int. Cl.
*C23C 16/56* (2006.01)
*B33Y 40/00* (2020.01)
*B33Y 30/00* (2015.01)
*B82Y 40/00* (2011.01)
*B82Y 30/00* (2011.01)

METHOD FOR MANUFACTURING AN ULTRA SMALL GRAIN-SIZE NANOCRYSTALLINE DIAMOND FILM HAVING A SIV PHOTOLUMINESCENCE

CROSS REFERENCE TO RELATED APPLICATIONS

This application is a Divisional of co-pending application Ser. No. 16/073,933, filed on Jul. 30, 2018 now abandoned, for which priority is claimed under 35 U.S.C. § 120; which is a 371 of international Application No. PCT/CN2017/103313, filed on Sep. 26, 2017, which claims priority of Application No. 201610870721.7 filed in China on Sep. 30, 2016 under 35 U.S.C. § 119, the entire contents of all of which are hereby incorporated by reference.

(I) TECHNICAL FIELD

The invention relates to a method for manufacturing an ultra small grain-size nanocrystalline diamond film having SiV photoluminescence.

(II) BACKGROUND ART

Nanocrystalline diamond particles have excellent biocompatibility and good optical stability, and it is easy to surface-modify and surface functionalize. Such properties make nanocrystalline diamond particles particularly suitable for biological applications, including intracellular labelling and tracking, extracellular drug delivery, and the adsorptive detection of bioactive molecules. Therefore, the luminescent color center caused by defects in diamond is extremely important. Color center refers to a defect in the crystal, which is caused by point defects, point defect pairs, or point defect groups capturing electrons or holes. The color center can cause light absorption in the visible spectral region. That is, the luminescence of the color center can be achieved by excitation in a certain manner. The color center having more stable structure, higher light-emitting efficiency, better spatial coherence, and shorter luminescence lifetime is more favorable in the application of biolabelling. Compared to other vacancy color centers, SiV luminescent color centers have better performance in these areas. Besides, the smaller nanocrystalline diamond particles are more favorable to enter the interior of the cell, and the intracellular location tracking is more accurate. Therefore, the successful preparation of ultra-small nanocrystalline diamond grains with SiV photoluminescent color centers is of great help to the application of nanocrystalline diamonds in biological experiments.

Nitrogen vacancies are common defects in diamond, and nanocrystalline diamonds containing nitrogen vacancies are easy to prepare. Researchers have used nanocrystalline diamonds with nitrogen vacancy luminescence for biological experiments. In diamond, nitrogen vacancy luminescence generally has electron-neutral nitrogen vacancy) ($NV^0$) luminescent centers and electron-negative nitrogen vacancy ($NV^-$) luminescent centers, both of which are stable. The zero phonon line of the former is at 575 nm, and there is a broader accompanying peak around 580-650 nm. The zero phonon line of the latter is at 637 nm, and there is an accompanying peak around 800 nm. Such a wide emitting range results in a low luminescent efficiency and poor spatial coherence of the luminescent nitrogen vacancy. In addition, some researchers' theoretical calculations found that the minimum grain size of nanodiamond to stably house a nitrogen vacancy is about 2 nm. It is very difficult to produce nanocrystalline diamonds with nitrogen vacancy in this size. Nanocrystalline diamond particles with nitrogen vacancy luminescence currently used in biological experiments are generally in the range of 5 to 10 nm. At the same time, the luminescence lifetime of nitrogen vacancy is as long as 25 ns. These limit the application of nanocrystalline diamond particles with nitrogen vacancy luminescence in biological experiments. The zero phonon line of the SiV color center has a very narrow luminescence peak (about 5 nm) at 738 nm, and its luminescence lifetime is very short, only about 1.2 ns. Theoretical calculations show that the SiV luminescent center can still exist stably when the nanocrystalline diamond grain size is 1.1~1.8 nm. In 2013, nanocrystalline diamond grains with SiV photoluminescent centers were found in meteorites, and the size of nanocrystalline diamond grains was about 2 nm. However, nanocrystalline diamond grains with uniform grain size up to 2 nm have not yet been experimentally prepared. Therefore, it is feasible to prepare ultra-small nanocrystalline diamond grains having SiV photoluminescent centers.

(III) SUMMARY OF THE INVENTION

The purpose of the present invention is to provide a method for manufacturing an ultra small grain-size nanocrystalline diamond film having SiV photoluminescent centers.

In order to prepare an ultra small grain-size nanocrystalline diamond film having SiV photoluminescent centers, the present invention uses microwave plasma chemical vapor deposition to deposit a nanocrystalline diamond film with the grain size of about 10 nm and having SiV luminescence on a single crystal silicon wafer. Then, the film is etched by oxygen plasma to gradually reduce the diamond grain size. Finally, a nanocrystalline diamond film with grain size of 2.5 to 5 nm and having SiV luminescence is obtained.

The technical solutions of the present invention are as follows:

A method for manufacturing an ultra small grain-size nanocrystalline diamond film having SiV photoluminescence, comprises:

(1) manufacturing, on a single crystal silicon substrate, a nanocrystalline diamond film having SiV photoluminescence by using a microwave plasma chemical vapor deposition method.

(2) performing oxygen plasma etching treatment on the nanocrystalline diamond film obtained in step (1) for 5-30 min in a mixed gas plasma with an oxygen-nitrogen gas volume ratio of 1:4-6 and at an atmospheric pressure of 0.5-6 torr and a microwave power of 600-1000 W, thereby obtaining the ultra small grain-size nanocrystalline diamond film having the SiV photoluminescence.

The oxygen plasma is generated using a microwave plasma chemical vapor deposition apparatus.

In the mixed gas plasma, oxygen plasma is used to etch diamonds, whereas the role of nitrogen is to help oxygen become plasma and reduce oxygen partial pressure.

In the ultra small grain-size nanocrystalline diamond film with SiV photoluminescence obtained by the method of the present invention, the size of the nanocrystalline diamond grains is in the range of 2.5 to 5 nm, and the size distribution is uniform.

In the step (1), a nanocrystalline diamond film is prepared on a single crystal silicon substrate by microwave plasma chemical vapor deposition (MPCVD) method, and can be performed by using a conventional microwave plasma chemical vapor deposition apparatus. The thickness of the nanocrystalline diamond film prepared in step (1) is usually 1 to 3 μm, and the grain size in the film is usually 6 to 10 nm.

Further, the operation method of the step (1) is:

(a) Pretreatment: first, the single crystal silicon substrate is ultrasonically vibrated in a mixture of Ti powder, diamond micron powder and acetone for 45 min, then it is put in fresh acetone and ultrasonically vibrated for 1 min; after drying, it is placed in fresh acetone again and ultrasonically vibrated for 1 min; after drying, the substrate for nanocrystalline diamond film growth is obtained.

In the mixture of Ti powder, diamond micron powder and acetone, the concentration of Ti powder is 0.001 to 0.005 g/mL, and the concentration of diamond micron powder is 0.001 to 0.005 g/mL.

(b) Depositing film: the single crystal silicon substrate pretreated in step (a) is placed into a microwave plasma chemical vapor deposition apparatus to deposit a nanocrystalline diamond film; the microwave plasma chemical vapor deposition method use a mixed gas with a methane-argon volume ratio of 1-2: 49 as the reaction gas and react at 400-500° C. for 1 h; thereby obtain a nanocrystalline diamond film has a thickness of 1-3 μm and a grain size of 6-10 nm on the single crystal silicon substrate surface.

The beneficial effects of the invention are mainly reflected in the following:

(1) The method is simple and easy to operate. The film growth and plasma bombardment to reduce grain size can complete in one device.

(2) The particle size distribution of the ultra-small diamond grains is uniform.

(3) The small size of diamond grains (2.5-5 nm) has important scientific significance and value for the application of nano-diamonds in biological experiments (biologic label tracing, drug delivery, etc.).

(IV) DESCRIPTION OF FIGURES

FIG. 1 Raman spectrum of sample etched in oxygen plasma for 10 min in example 1

Figure 2:
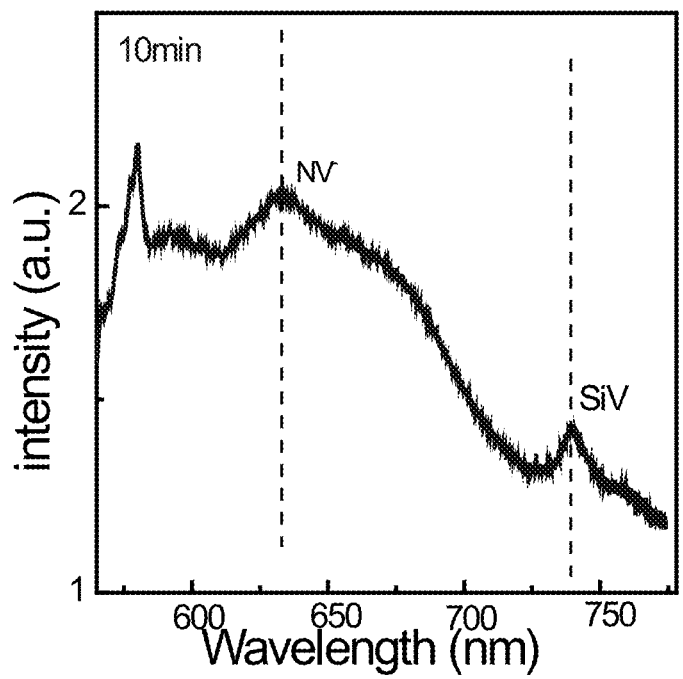

FIG. 2 Photoluminescence spectrum of sample etched in oxygen plasma for 10 min in example 1

Figure 3:
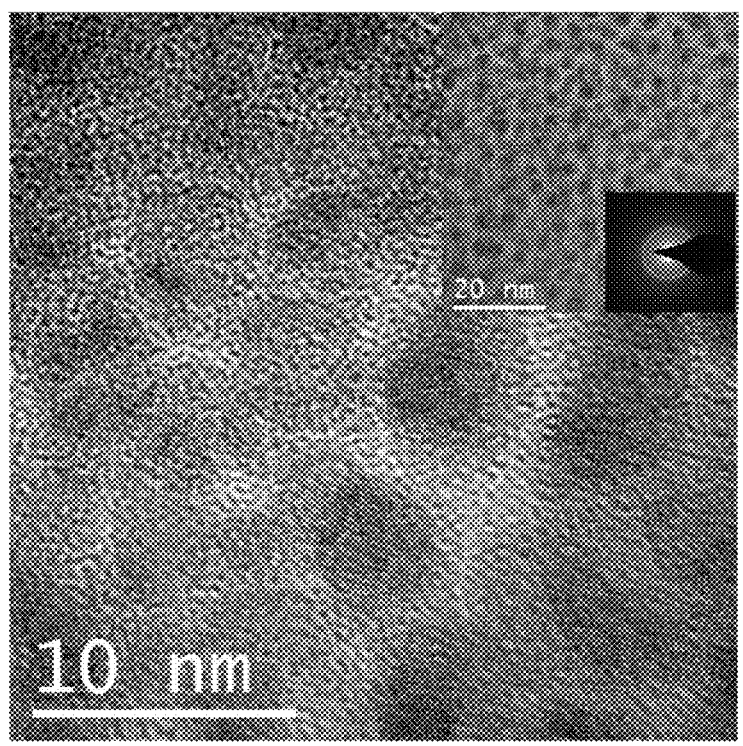

FIG. 3 Transmission electron microscopy images of sample etched in oxygen plasma for 10 min in example 1

Figure 4:
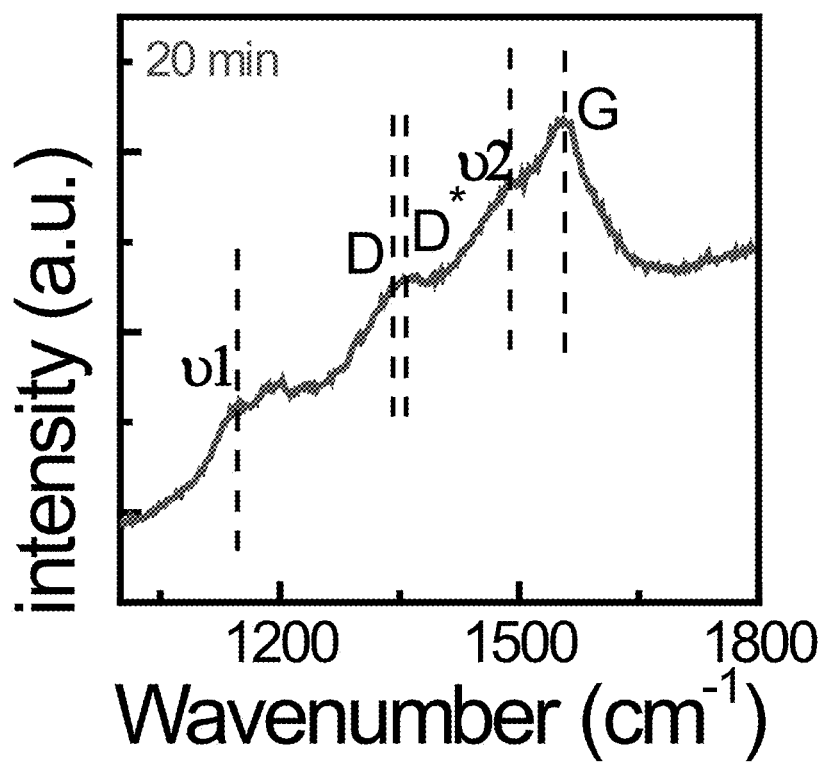

FIG. 4 Raman spectrum of sample etched in oxygen plasma for 20 min in example 2

Figure 5:
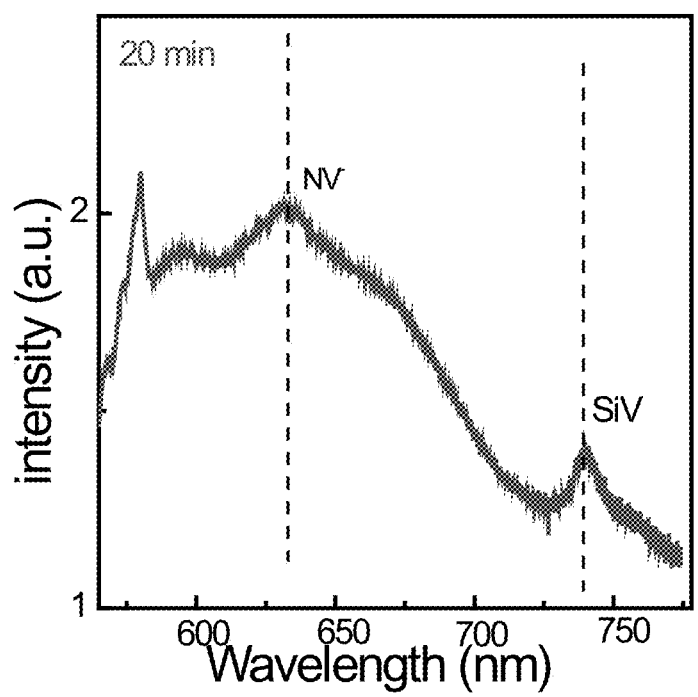

FIG. 5 Photoluminescence spectrum of sample etched in oxygen plasma for 20 min in example 2

Figure 6:
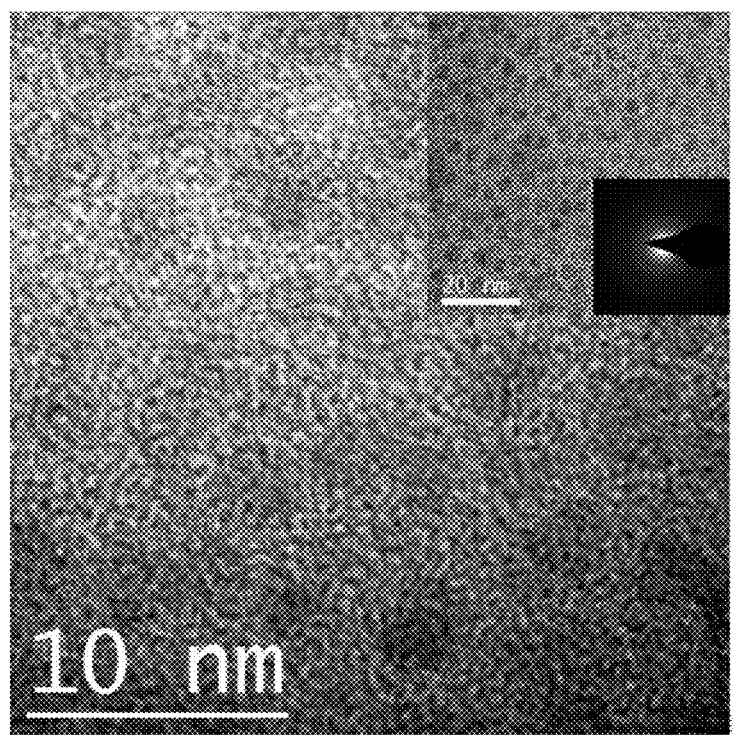

FIG. 6 Transmission electron microscopy images of sample etched in oxygen plasma for 20 min in example 2

(V) EMBODIMENTS

The present invention will be further described below with reference to specific embodiments, but the scope of protection of the present invention is not limited thereto.

Example 1

First, the single crystal silicon substrate was ultrasonically vibrated (ultrasound power 200 W) in a mixture of Ti powder (0.1 g), diamond micron powder (0.1 g) and acetone (50 mL) for 45 min, then it was put in fresh acetone and ultrasonically vibrated for 1 min. After drying, it was placed in fresh acetone again and ultrasonically vibrated for 1 min. After drying, the substrate for nanocrystalline diamond film growth was obtained. The above pre-treated single crystal silicon substrate was placed into a microwave plasma chemical vapor deposition apparatus to deposit a nanocrystalline diamond film. The microwave plasma chemical vapor deposition method used methane and argon as gas source, the methane-argon gas volume ratio was 4:196, the growth power was 1200 W, the growth pressure was 150 torr, and the growth time was 1 h. The obtained nanocrystalline diamond film had a thickness of about 1 μm and a grain size of about 10 nm. The microwave plasma chemical vapor deposition apparatus was produced by Taiwan Mastek Technologies, Inc. The cavity of the apparatus was 6 inches and the model number was IPLAS-CYRANNUS.

Oxygen plasma treatment was performed on the nanocrystalline diamond film obtained above by using a microwave plasma chemical vapor deposition apparatus. The gas source was 20 sccm of oxygen and 80 sccm of nitrogen, the microwave power was 900 W and the chamber pressure was 5 torr. After 10 minutes of treatment, the ultra small grain-size nanocrystalline diamond film having SiV photoluminescence was obtained.

The Raman spectrum with a laser wavelength of 532 nm was used to analyze the composition of the film, as shown in FIG. 1. It can be seen that characteristic peaks at 1140, 1332, 1350, 1470, and 1560 cm$^{-1}$ appeared in the spectrogram, and at 1332 cm$^{-1}$ was a characteristic peak of diamond, but it was not apparent in the spectrum because the grain size was too tiny. The characteristic peak at 1560 cm$^{-1}$ belonged to disordered sp$^2$ bond graphite. The characteristic peaks at 1140 and 1470 cm$^{-1}$ belonged to trans-polyacetylene chain. The characteristic peak at 1350 cm$^{-1}$ belonged to sp$^a$ bond carbon cluster. It was concluded that the film consisted mainly of diamond phase and disordered graphite phase, but the grain boundary contained a small amount of other phases, which was consistent with the visible Raman spectrum of normal nanocrystalline diamond films.

The PL spectrum with a laser wavelength of 532 nm was used to analyze the photoluminescence properties of the oxygen plasma treated film, as shown in FIG. 2. It could be seen that the SiV luminescence peak appeared at 738 nm in the PL spectrogram, and there was a nitrogen vacancy luminescence peak at 637 nm. However, as mentioned before, the peak width of the nitrogen vacancy luminescence peak was too wide to be suitable for biolabelling. This showed that we have prepared nanocrystalline diamond films with SiV luminescent centers.

High-resolution transmission electron microscopy was used to analyze the microstructure of the sample, as shown in FIG. 3. It could be observed that after 10 minutes of oxygen plasma treatment, the grain size of the sample was around 4-5 nm, and the grain size distribution was uniform. The corresponding selected area electron diffraction pattern indicated that these grains were diamond grains. This showed that when the oxygen plasma treatment was performed for 10 minutes, the nanocrystalline diamond film having a grain size of 4-5 nm and having SiV luminescent centers was obtained.

Example 2

First, the single crystal silicon substrate was ultrasonically vibrated (ultrasound power 200 W) in a mixture of Ti powder (0.1 g), diamond micron powder (0.1 g) and acetone (50 mL) for 45 min, then it was put in fresh acetone and ultrasonically vibrated for 1 min. After drying, it was placed in fresh acetone again and ultrasonically vibrated for 1 min. After drying, the substrate for nanocrystalline diamond film growth was obtained. The above pre-treated single crystal silicon substrate was placed into a microwave plasma chemical vapor deposition apparatus to deposit a nanocrystalline diamond film. The microwave plasma chemical vapor deposition method used methane and argon as gas source, the methane-argon gas volume ratio was 4:196, the growth power was 1200 W, the growth pressure was 150 torr, and the growth time was 1 h. The obtained nanocrystalline diamond film had a thickness of about 1 μm and a grain size of about 10 nm. The microwave plasma chemical vapor deposition apparatus was produced by Taiwan Mastek Technologies, Inc. The cavity of the apparatus was 6 inches and the model number was IPLAS-CYRANNUS.

Oxygen plasma treatment was performed on the nanocrystalline diamond film obtained above by using a microwave plasma chemical vapor deposition apparatus. The gas source was 20 sccm of oxygen and 80 sccm of nitrogen, the microwave power was 900 W and the chamber pressure was 5 torr. After 20 minutes of treatment, the ultra small grain-size nanocrystalline diamond film having SiV luminescence was obtained.

The Raman spectrum with a laser wavelength of 532 nm was used to analyze the composition of the film, as shown in FIG. 4. It can be seen that characteristic peaks at 1140, 1332, 1350, 1470, and 1560 cm$^{-1}$ appeared in the spectrogram, and at 1332 cm$^{-1}$ was a characteristic peak of diamond, but it was not apparent in the spectrum because the grain size was too tiny. The characteristic peak at 1560 cm$^{-1}$ belonged to disordered sp$^2$ bond graphite. The characteristic peaks at 1140 and 1470 cm$^{-1}$ belonged to trans-polyacetylene chain. The characteristic peak at 1350 cm$^{-1}$ belonged to sp$^a$ bond carbon cluster. It was concluded that the film consisted mainly of diamond phase and disordered graphite phase, but the grain boundary contained a small amount of other phases, which was consistent with the visible Raman spectrum of normal nanocrystalline diamond films.

The PL spectrum with a laser wavelength of 532 nm was used to analyze the photoluminescence properties of the oxygen plasma treated film, as shown in FIG. 5. It could be seen that the SiV luminescence peak appeared at 738 nm in the PL spectrogram. This showed that we have prepared nanocrystalline diamond films with SiV luminescent centers.

High-resolution transmission electron microscopy was used to analyze the microstructure of the sample, as shown in FIG. 6. It could be observed that after 20 minutes of oxygen plasma treatment, the grain size of the sample was around 2.5-4 nm, and the grain size distribution was uniform. The corresponding selected area electron diffraction pattern indicated that these grains were diamond grains. This showed that when the oxygen plasma treatment was performed for 20 minutes, the nanocrystalline diamond film having a grain size of 2.5-4 nm and having SiV luminescent centers was obtained.

Comparative Example 1

Igor I. Vlasov et al. directly prepared a small grain-size nanocrystalline diamond film on a 10 mm×10 mm×0.5 mm silicon wafer using a microwave plasma chemical vapor deposition method. The gas ratio was 93% Ar/5% H2/2% CH$_4$, the growth pressure was 1.2×10$^4$ Pa, the microwave power was 2.4 kW, and the film thickness was 1 micron. Reference "Vlasov II, Barnard AS, Ralchenko V G, Lebedev O I, Kanzyuba M V, Saveliev A V, et al. Nanodiamond Photoemitters Based on Strong Narrow-Band Luminescence from Silicon-Vacancy Defects. Advanced materials. 2009; 21(7): 808-12."

High-resolution transmission electron microscopy was used to characterize the microstructure of the film. The sample did contain 2-5 nm particles. However, the distribution of crystalline grains was nonuniform and the uniformity of the film could not be proved. Besides, the sample was tested with Raman spectrum at a laser wavelength of 488 nm. Compared with the microcrystalline diamond film, it was found that the nanocrystalline diamond film had a strong diamond peak, which also indicated that there were large-sized nanocrystalline diamond particles in the sample. That was, the grain size distribution in the film was not uniform.

This showed that we could prepare a nanocrystalline diamond film with ultra small grain-size and uniform grain size distribution by first preparing a uniform nanocrystalline diamond film with size of 6-10 nm and then reducing the diamond grains by microwave plasma treatment.

The invention claimed is:

1. A method for manufacturing an ultra small grain-size nanocrystalline diamond film having SiV photoluminescence, comprises:
   (1) manufacturing, on a single crystal silicon substrate, a nanocrystalline diamond film having SiV photoluminescence by using a microwave plasma chemical vapor deposition method,
   (2) performing oxygen plasma etching treatment on the nanocrystalline diamond film obtained in step (1) for 5-30 min in a mixed gas plasma with an oxygen-nitrogen gas volume ratio of 1:4-6 and at an atmospheric pressure of 0.5-6 torr and a microwave power of 600-1000 W, thereby obtaining the ultra small grain-size nanocrystalline diamond film having the SiV photoluminescence.

2. The method according to claim 1, wherein in the ultra small grain-size nanocrystalline diamond film having SiV photoluminescence, the size of the nanocrystalline diamond grains is 2.5 to 5 nm, and the size distribution is uniform.

3. The method according to claim 1, wherein the thickness of the nanocrystalline diamond film prepared in step (1) is 1-3 μm, and the grain size in the film is 6-10 nm.

4. The method according to claim 1, wherein the operation method of the step (1) is:
   (a) Pretreatment: first, the single crystal silicon substrate is ultrasonically vibrated in a mixture of Ti powder, diamond micron powder and acetone for 45 min, then it is put in fresh acetone and ultrasonically vibrated for 1 min; after drying, it is placed in fresh acetone again and ultrasonically vibrated for 1 min; after drying, the substrate for nanocrystalline diamond film growth is obtained,
   (b) Depositing film: the single crystal silicon substrate pretreated in step (a) is placed into a microwave plasma chemical vapor deposition apparatus to deposit a nanocrystalline diamond film; the microwave plasma chemical vapor deposition method use a mixed gas with a methane-argon volume ratio of 1-2:49 as the reaction gas and react at 400-500° C. for 1 h; thereby obtain a nanocrystalline diamond film has a thickness of 1-3 μm and a grain size of 6-10 nm on the single crystal silicon substrate surface.

5. The method according to claim 4, wherein in the mixture of Ti powder, diamond micron powder and acetone, the concentration of Ti powder is 0.001 to 0.005 g/mL, and the concentration of diamond micron powder is 0.001 to 0.005 g/mL.

\* \* \* \* \*